US012777661B2

(12) United States Patent
Cai et al.

(10) Patent No.: US 12,777,661 B2
(45) Date of Patent: Oct. 27, 2026

(54) CAPACITOR STRUCTURES OF SEMICONDUCTOR DEVICES

(71) Applicant: GlobalFoundries Singapore Pte. Ltd., Singapore (SG)

(72) Inventors: Xinshu Cai, Singapore (SG); Shyue Seng Tan, Singapore (SG)

(73) Assignee: GLOBALFOUNDRIES Singapore Pie. Ltd., Singapore (SG)

( * ) Notice: Subject to any disclaimer, the term of this patent is extended or adjusted under 35 U.S.C. 154(b) by 738 days.

(21) Appl. No.: 18/177,087

(22) Filed: Mar. 1, 2023

(65) Prior Publication Data

US 2024/0297211 A1 Sep. 5, 2024

(51) Int. Cl.
*H01L 21/02* (2006.01)
*H10D 1/00* (2025.01)
*H10D 1/68* (2025.01)

(52) U.S. Cl.
CPC ............. *H10D 1/042* (2025.01); *H10D 1/716* (2025.01)

(58) Field of Classification Search
CPC .......... H10D 1/047; H10D 1/68; H10D 1/692; H10D 64/66; H10D 64/665; H10D 64/667; H10D 64/661
See application file for complete search history.

(56) References Cited

U.S. PATENT DOCUMENTS 6,057,572 A * 5/2000 Ito .......................... H10D 1/047 257/532
8,729,666 B2 5/2014 Stribley et al.
10,748,986 B2 8/2020 Luo et al.
2004/0140527 A1 7/2004 Furuya et al.
2006/0263976 A1 11/2006 Sakamoto
2016/0260795 A1* 9/2016 Abe ........................ H10B 43/40

FOREIGN PATENT DOCUMENTS

CN 101937878 A 1/2011
CN 111525030 A 8/2020
JP 2000307129 A 11/2000

OTHER PUBLICATIONS

European Patent Office, Extended European Search Report and Opinion issued in European Patent Application No. 23204521.1 on Apr. 5, 2024; 11 pages.
D. B. Slater and J. J. Paulos, "Low-voltage coefficient capacitors for VLSI processes," in IEEE Journal of Solid-State Circuits, vol. 24, No. 1, pp. 165-173, Feb. 1989, doi: 10.1109/4.16316.
S. Yoshihara et al., "A 1/1.8-inch 6.4 MPixel 60 frames/s CMOS Image Sensor With Seamless Mode Change," in IEEE Journal of Solid-State Circuits, vol. 41, No. 12, pp. 2998-3006, Dec. 2006, doi: 10.1109/JSSC.2006.884868.
S. Sukegawa et al., "A ¼-inch 8Mpixel back-illuminated stacked CMOS image sensor," 2013 IEEE International Solid-State Circuits Conference Digest of Technical Papers, San Francisco, CA, USA, 2013, pp. 484-485, doi: 10.1109/ISSCC.2013.6487825.

* cited by examiner

*Primary Examiner* — John A Bodnar
(74) *Attorney, Agent, or Firm* — David Cain

(57) ABSTRACT

A capacitor structure is provided. The capacitor structure includes a substrate, a first electrode, a second electrode, and a third electrode. The first electrode is in the substrate. The second electrode is over the substrate. The third electrode is over the second electrode and includes a middle portion over the second electrode and end portions laterally adjacent to the second electrode.

20 Claims, 3 Drawing Sheets

CAPACITOR STRUCTURES OF SEMICONDUCTOR DEVICES

TECHNICAL FIELD

The present disclosure relates generally to semiconductor devices, and more particularly to capacitor structures and methods of forming the same.

BACKGROUND

Technological advances in the semiconductor integrated circuit (IC) industry have brought about ever-decreasing sized IC chips with a higher density of semiconductor devices. Miniaturization, or the downsizing, of the semiconductor devices, for example, transistors, diodes, capacitors, or resistors, in the IC chips has been the key to achieving overall device improvements.

In order to meet the growing needs of the semiconductor industry, semiconductor devices enabling further device miniaturization to form highly functional IC chips on a smaller chip area and methods of forming the same are provided.

SUMMARY

To achieve the foregoing and other aspects of the present disclosure, capacitor structures of semiconductor devices and methods of forming the same are presented.

According to an aspect of the present disclosure, a capacitor structure is provided. The capacitor structure includes a substrate, a first electrode, a second electrode, and a third electrode. The first electrode is in the substrate. The second electrode is over the substrate. The third electrode is over the second electrode and includes a middle portion over the second electrode and end portions laterally adjacent to the second electrode.

According to another aspect of the present disclosure, a capacitor structure is provided. The capacitor structure includes a substrate, a conductive well, a first electrode, a second electrode, and a third electrode. The conductive well is in the substrate and the first electrode is in the conductive well. The second electrode is over the substrate. The third electrode is over the second electrode and includes a middle portion over the second electrode and end portions laterally adjacent to the second electrode. The first electrode, the second electrode, and the third electrode include dopants of the same conductivity.

According to yet another aspect of the present disclosure, a method of forming a capacitor structure is provided. The method includes forming a first electrode in a substrate and forming a second electrode over the substrate. A third electrode including a middle portion and end portions is formed over the second electrode, the middle portion thereof is formed over the second electrode and the end portions thereof are formed laterally adjacent to the second electrode.

BRIEF DESCRIPTION OF THE DRAWINGS

The embodiments of the present disclosure will be better understood from a reading of the following detailed description, taken in conjunction with the accompanying drawings.

Figure 1A:
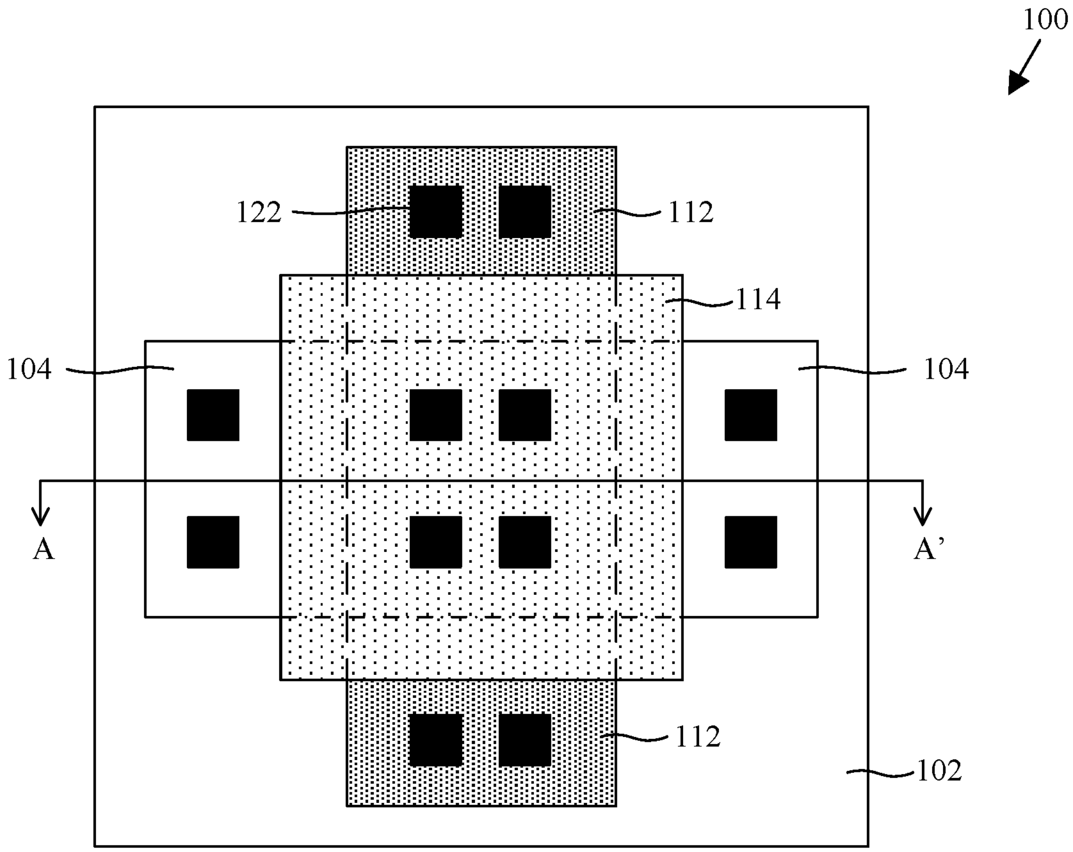
FIG. 1A is a top-down view of a capacitor structure and FIG. 1B is a cross-sectional view of the capacitor structure in FIG. 1A, taken generally along a line A-A thereof, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, features in the drawings are not necessarily drawn to scale. For example, the dimensions of some of the features in the drawings may be exaggerated relative to other features to help improve the understanding of the embodiments of the device. The same reference numerals in different drawings denote the same features, while similar reference numerals may, but do not necessarily, denote similar features.

DETAILED DESCRIPTION

The present disclosure relates to capacitor structures of semiconductor devices and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

Figure 1B:
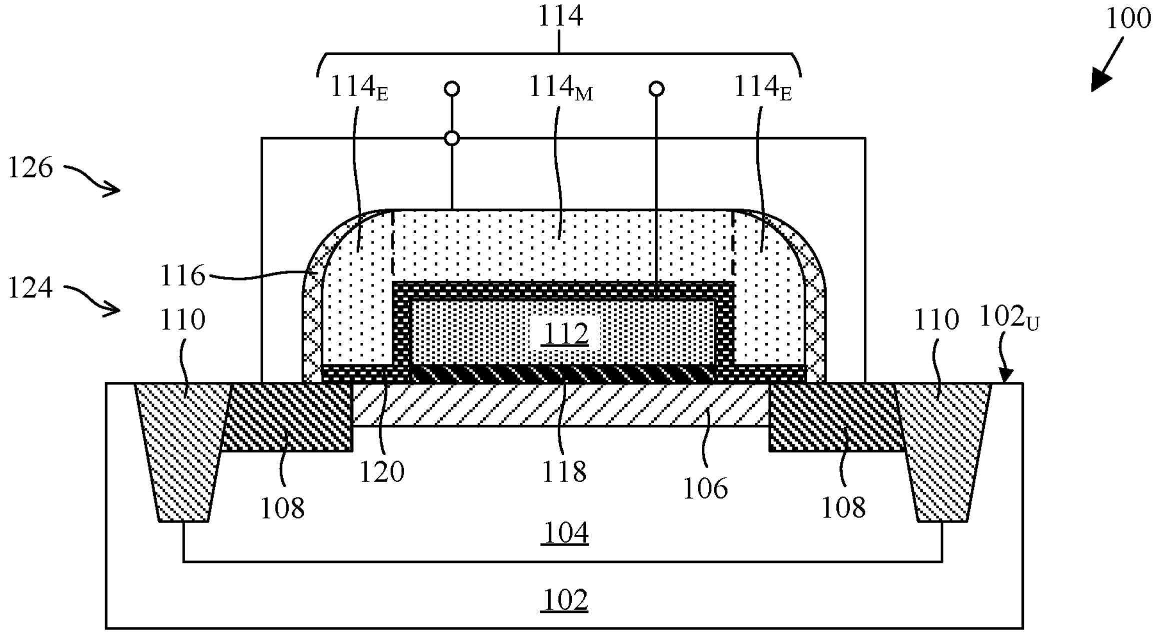

FIG. 1A is a top-down view of a capacitor structure 100 and FIG. 1B is a cross-sectional view of the capacitor structure 100 in FIG. 1A, taken generally along line A-A' thereof, according to an embodiment of the disclosure. The capacitor structure 100 may include a substrate 102 having an upper substrate surface $\mathbf{102}_U$. The substrate 102 may include a semiconductor material, for example, silicon, germanium, silicon germanium, silicon carbide, or other II-VI or III-V semiconductor compounds.

The substrate 102 may include a conductive well 104 extending downwardly from the upper substrate surface $\mathbf{102}_U$. The conductive well 104 may include either n-type conductivity dopants or p-type conductivity dopants. N-type conductivity dopants may include arsenic, phosphorus, or antimony, and p-type conductivity dopants may include boron, aluminum, or gallium. The conductive well 104 may provide a conductive pathway in the substrate 102.

The substrate 102 may further include an electrode 106 and diffusion regions 108 in the conductive well 104. The diffusion regions 108 may be laterally adjacent to the electrode 106. The electrode 106 and the diffusion regions 108 may be doped regions in the substrate 102 extending downwardly from the upper substrate surface $\mathbf{102}_U$. The electrode 106 and the diffusion regions 108 may extend to a depth shallower than the conductive well 104. Even though the electrode 106 is illustrated to have a shallower depth than the diffusion regions 108 in FIG. 1B, the electrode 106 may have a substantially similar depth as the diffusion regions 108. In an embodiment of the disclosure, the electrode 106 may have a depth of at most about 20 nanometers (nm) from the upper substrate surface $\mathbf{102}_U$.

The electrode 106 and the diffusion regions 108 may include dopants having the same conductivity as the dopants in the conductive well 104, though not necessarily the same dopants. In an embodiment of the disclosure, the dopant concentration of the electrode 106 may be at most as high as the dopant concentration of the diffusion regions 108. In another embodiment of the disclosure, the dopant concentrations of the electrode 106 and the diffusion regions 108 may be higher than the dopant concentration of the conductive well 104.

The substrate 102 may also include isolation structures 110 arranged therein. The isolation structures 110 may isolate electrically conductive the capacitor structure 100 from adjacent electrically conductive features, for example, another capacitor structure or a transistor. The isolation structures 110 may extend downwardly from the upper substrate surface $\mathbf{102}_U$ to a depth at least deeper than the diffusion regions 108. The isolation structures 110 may also extend to a depth deeper than the conductive well 104, according to another embodiment of the disclosure. The isolation structures 110 may include an electrically insulative material, for example, silicon oxide.

The capacitor structure 100 may further include an electrode 112 and an electrode 114 over the substrate 102. The electrode 112 may overlap at least a portion of the conductive well 104. For example, as illustrated in FIG. 1A, a portion of the electrode 112 may overlap the conductive well 104 and a portion thereof extending beyond the conductive well 104. The portion of the electrode 112 overlapping the conductive well 104 may be vertically over the electrode 106 which is in the conductive well 104, as illustrated in FIG. 1B. The portion of the conductive well 104 under the electrode 112 is diagrammatically shown by a dash-dot line for purposes of illustration in FIG. 1A.

The electrode 114 may enclose a portion of the electrode 112 thereunder. For example, the electrode 114 may include a middle portion $\mathbf{114}_M$ between end portions $\mathbf{114}_E$, and the middle portion $\mathbf{114}_M$ may be vertically over the electrode 112, while the end portions $\mathbf{114}_E$ may be laterally adjacent to the electrode 112; the transition of the end portion $\mathbf{114}_E$ to the middle portion $\mathbf{114}_M$ is diagrammatically shown by a dashed line for purposes of illustration in FIG. 1B. The portion of the electrode 112 under the electrode 114 is diagrammatically shown by a dashed line for purposes of illustration in FIG. 1A. The electrode 114 may extend beyond the conductive well 104, as illustrated in FIG. 1A, though not necessarily so.

The electrodes 112, 114 may include an electrically conductive material, for example, a semiconductor material such as polysilicon or a metallic material such as tungsten. In an embodiment of the disclosure, the electrode 112 may include the same electrically conductive material as the electrode 114. In another embodiment of the disclosure, the electrode 112 may include a different electrically conductive material from the electrode 114.

The electrodes 112, 114 may include dopants having the same conductivity as the dopants in the electrode 106, though not necessarily the same dopants. In an embodiment of the disclosure, the dopant concentration of the electrode 112 may substantially be similar to the dopant concentration of the electrode 114. In another embodiment of the disclosure, the dopant concentrations of the electrode 112 and the electrode 114 may be at most as high as the dopant concentration of the electrode 106. In yet another embodiment of the disclosure, the dopant concentrations of the electrode 112 and the electrode 114 may be substantially similar to the dopant concentration of the diffusion regions 108.

Additionally, spacers 116 may be arranged on side surfaces of the electrode 114. The spacers 116 may electrically isolate the electrode 114 from adjacent electrically conductive features. The spacers 116 may include an electrically insulative material, for example, silicon oxide and/or silicon nitride.

The capacitor structure 100 may yet further include dielectric layers 118, 120 over the substrate 102, as illustrated in FIG. 1B. The dielectric layers 118, 120 may at least electrically isolate the electrodes 106, 112, 114 from each other. The dielectric layer 118 may be arranged on the upper substrate surface $\mathbf{102}_U$, separating the electrode 112 therefrom. The dielectric layer 120 may be arranged between the electrodes 112, 114, for example, the dielectric layer 120 may overlie a top surface and side surfaces of the electrode 112. Accordingly, the electrode 112 may be collectively surrounded by the dielectric layers 118, 120. The dielectric layer 120 may further include a dielectric end portion extending on the upper substrate surface $\mathbf{102}_U$, separating the electrode 114 from the substrate 102. In an embodiment of the disclosure, the dielectric layer 118 may include a lower surface and the dielectric layer 120 may include a lower surface that is substantially coplanar with the lower surface of the dielectric layer 118.

The dielectric layer 118 may have a thickness at least as thick as the dielectric layer 120. For example, the thickness of the dielectric layer 118 may be substantially similar to the thickness of the dielectric layer 120. In another example, the thickness of the dielectric layer 118 may be thinner than the dielectric layer 120. In an embodiment of the disclosure, the dielectric layer 118 may have a thickness of about 2 nm.

The dielectric layers 118, 120 may include a single-layered or a multi-layered electrically insulative material. A singled-layered electrically insulative material may include silicon oxide or silicon nitride, and a multi-layered electrically insulative material may include silicon oxide and silicon nitride. In an embodiment of the disclosure, the dielectric layer 118 may include the same electrically insulative material as the dielectric layer 120. In another embodiment of the disclosure, the dielectric layer 118 may include a different electrically insulative material from the dielectric layer 120. In yet another embodiment of the disclosure, the dielectric layer 118 may be single-layered and the dielectric layer 120 may be multi-layered.

The electrodes 106, 112 and the dielectric layer 118 may serve as a first capacitor 124 of the capacitor structure 100, and the electrode 112, the electrode 114, and the dielectric layer 120 may serve as a second capacitor 126 of the capacitor structure 100. Accordingly, the electrode 112 may serve as a common capacitor electrode of the first capacitor 124 and the second capacitor 126. The unit capacitance of the first capacitor 124 may or may not be greater than the unit capacitance of the second capacitor 126. For example, the unit capacitance of the second capacitor 126 may be greater than the unit capacitance of the first capacitor 124 as capacitance, in general, is proportional to the smallest surface area of either electrode of a capacitor. The surface area of the electrode 112 serving as an electrode surface of the second capacitor 126, i.e., the side surfaces and the top surface thereof, may be greater than the surface area of the electrode 112 serving as an electrode surface of the first capacitor 124, i.e., the bottom surface thereof. In another example, in embodiments where the dielectric layer 118 may be thinner than the dielectric layer 120, the unit capacitance of the first capacitor 124 may be greater than the unit capacitance of the second capacitor 126 as capacitance, in general, is also inversely proportional to the separation between the electrodes of a capacitor.

The capacitor structure 100 may also include contacts 122. The contacts 122 may be arranged over and electrically coupled to each of the electrodes 106, 112, 114. For example, the electrodes 112, 114 may be electrically coupled to their corresponding contacts 122 that are arranged vertically thereover, while the electrode 106 may be electrically coupled to its corresponding contacts 122 through the diffusion regions 108. The contacts 122 may enable the electrodes 106, 112, 114 to be placed at appropriate electrical potentials to serve as capacitor electrodes. For example, the electrodes 106, 114 may be electrically coupled through their corresponding contacts 122 to the same terminal at the same electrical potential, while the electrode 112 may be electrically coupled through its corresponding contacts 122 to a different terminal at a different electrical potential. Alternatively, the electrodes 106, 112, 114 may be electrically coupled to different terminals at different electrical potentials.

Figure 2:
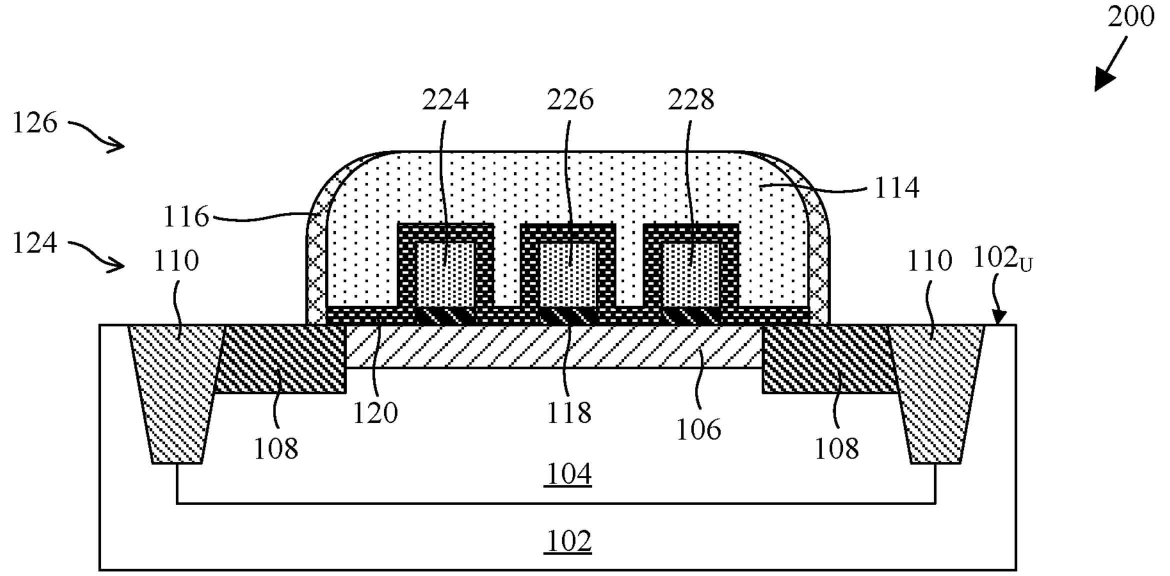
FIG. 2 is a cross-sectional view of a capacitor structure, according to another embodiment of the disclosure.

FIG. 2 illustrates a cross-sectional view of a capacitor structure 200, according to another embodiment of the disclosure. The capacitor structure 200 may be similar to the capacitor structure 100, and thus common features are labeled with the same reference numerals and need not be separately discussed.

The capacitor structure 200 may include electrodes 224, 226, 228. The electrodes 224, 226, 228 may be similar to the electrode 112 of the capacitor structure 100 in FIG. 1B. The electrode 114 may enclose a portion of the electrodes 224, 226, 228 thereunder. The dielectric layer 118 may be arranged on the substrate 102, separating the electrodes 224, 226, 228 therefrom. The dielectric layer 120 may be arranged over the electrodes 224, 226, 228, overlying the respective top surfaces and side surfaces thereof. Similar to the electrode 112 of the capacitor structure 100 in FIG. 1B, the electrodes 224, 226, 228 may each be collectively surrounded by the dielectric layers 118, 120. A portion of the electrode 114 may be arranged between the electrodes 224, 226, 228.

The electrodes 224, 226, 228 may be connected as a single electrode. Alternatively, the electrodes 224, 226, 228 may be discrete electrodes having their respective contacts (not shown) electrically coupling thereto, placing the electrodes 224, 226, 228 at appropriate electrical potentials to serve as capacitors of the capacitor structure 200.

Figure 3:
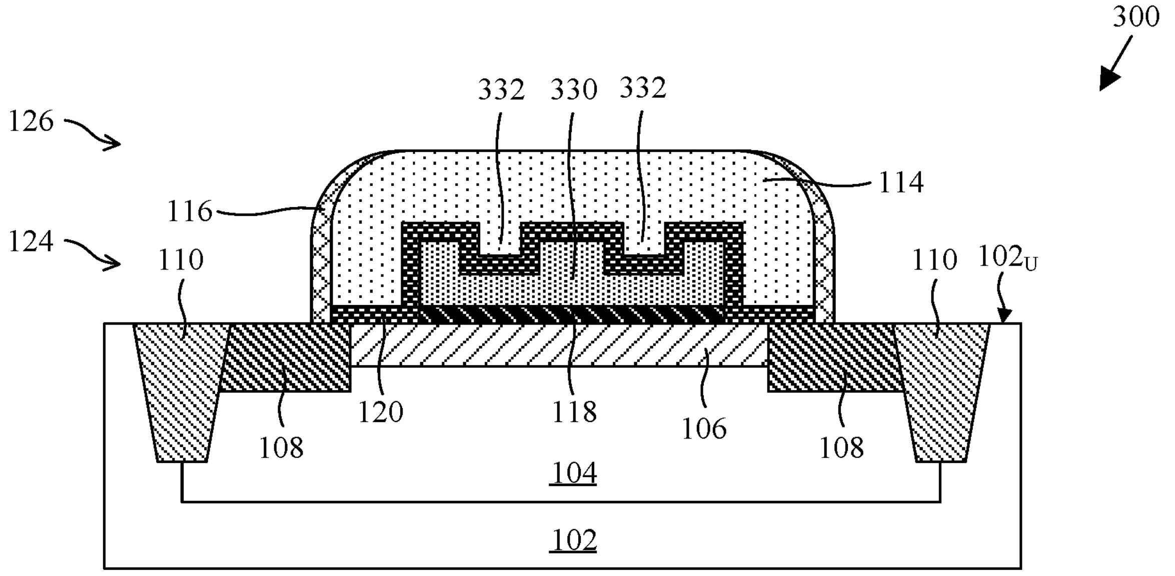
FIG. 3 is a cross-sectional view of a capacitor structure, according to yet another embodiment of the disclosure.

FIG. 3 illustrates a cross-sectional view of a capacitor structure 300, according to yet another embodiment of the disclosure. The capacitor structure 300 may be similar to the capacitor structure 100, and thus common features are labeled with the same reference numerals and need not be separately discussed.

The capacitor structure 300 may include an electrode 330. The electrode 330 may be similar to the electrode 112 of the capacitor structure 100 in FIG. 1B. The electrode 330 may further include a trench 332 in an upper portion thereof. The electrode 330 may extend downwardly from an upper surface thereof and terminate within the electrode 330. The trench 332 may result in the electrode 330 having different thicknesses along a length thereof, the length being a dimension extending between the diffusion regions 108. For example, the electrode 330 may include a first thickness under the trench 332 and a second thickness laterally adjacent to the trench, and the first thickness is thinner than the second thickness.

Figure 4A:
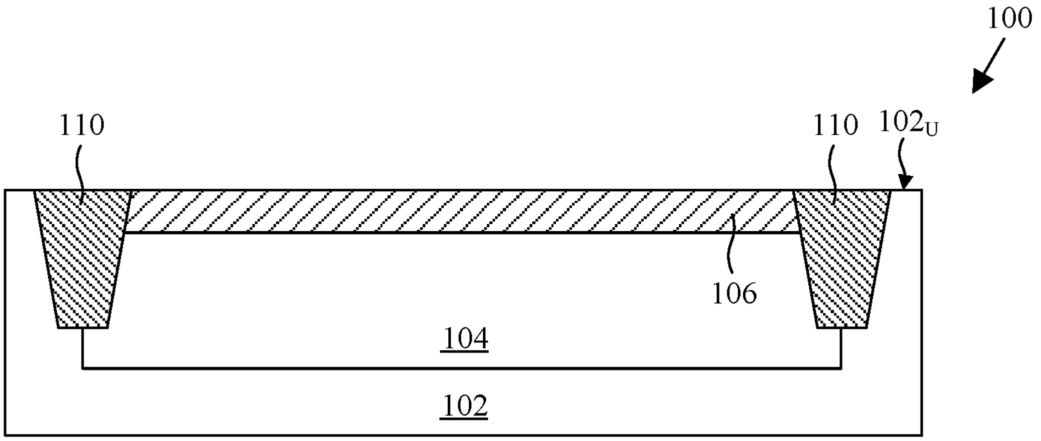
FIGS. 4A to 4C are cross-sectional views of the capacitor structure in FIG. 1, illustrating a processing method of forming thereof, according to an embodiment of the disclosure.
Figure 4B:
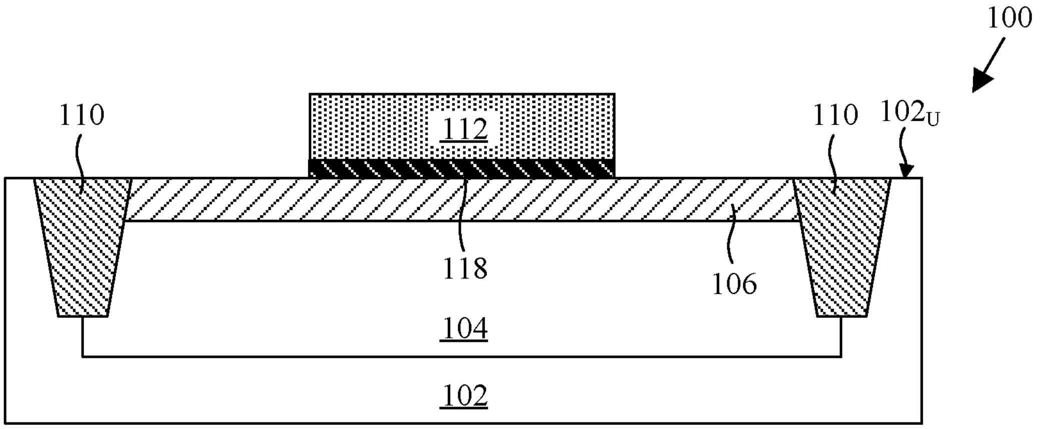
Figure 4C:
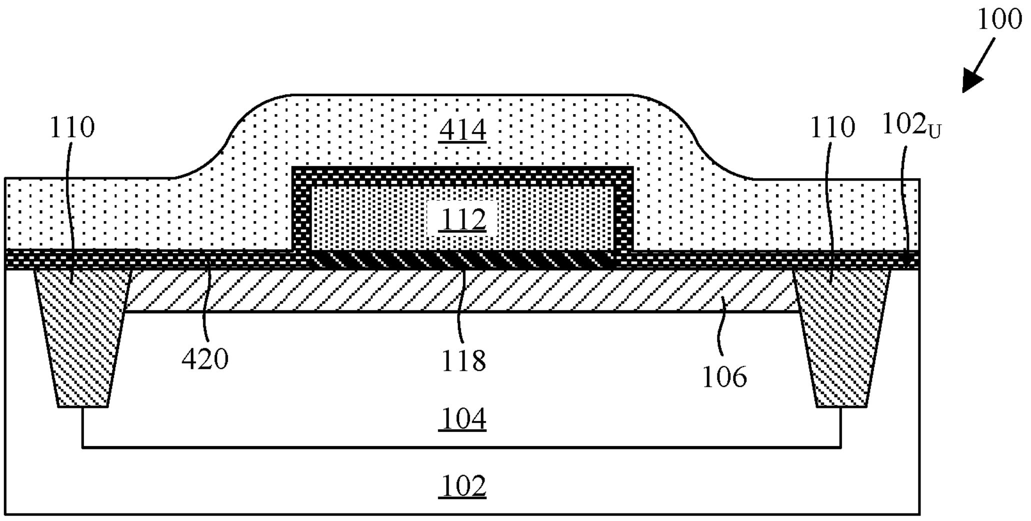

FIGS. 4A to 4C are cross-sectional views of the capacitor structure 100, illustrating a processing method of forming thereof, according to an embodiment of the disclosure. Certain structures may be conventionally fabricated, for example, using known processes and techniques, and specifically disclosed processes and methods may be used to achieve individual aspects of the present disclosure.

FIG. 4A illustrates the capacitor structure 100 at an initial fabrication stage of a processing method, according to an embodiment of the disclosure. A conductive well 104 and an electrode 106 may be formed in the substrate 102, extending downwardly from an upper substrate surface 102$_U$. The conductive well 104 and the electrode 106 may be formed by introducing dopants into the substrate 102 using a doping technique, for example, an ion implantation process. The conductive well 104 and the electrode 106 may be formed with dopants having the same conductivity, for example, either n-type dopants or p-type dopants, though not necessarily the same dopants. The conductive well 104 may be formed with a lower dopant concentration than the electrode 106.

Isolation structures 110 may be formed in the substrate 102 such that at least the electrode 106 may be arranged therebetween. the isolation structures 110. The isolation structures 110 may be used to define regions where various semiconductor devices, for example, the capacitor structure 100, may be formed therein and thereupon the substrate 102. The isolation structures 110 may be formed using a patterning technique, including lithography and etching processes, to form a trench (not shown) in the substrate 102. The trench may at least extend to a depth deeper than the electrode 106. Subsequently, the trench may be filled with an electrically insulative material, for example, silicon oxide. In an embodiment of the disclosure, the isolation structures 110 may be formed before forming the conductive well 104 and the electrode 106.

FIG. 4B is a cross-sectional view of the capacitor structure 100 at a fabrication stage subsequent to FIG. 4A, according to an embodiment of the disclosure. A dielectric layer 118 and an electrode 112 may be formed over the electrode 106. A layer of dielectric material (not shown) and a layer of electrode material (not shown) may be sequentially deposited over the substrate 102 using a deposition technique, including a chemical vapor deposition (CVD) process. The layer of dielectric material and a layer of electrode material may be subsequently patterned using a patterning technique, including lithography and etching processes, to form the dielectric layer 118 and the electrode 112, respectively. The dielectric layer 118 and the electrode 112 may have substantially coplanar side surfaces that terminate over the electrode 106. In an embodiment of the disclosure, the electrode 112 may have a thickness of about 80 nm.

FIG. 4C is a cross-sectional view of the capacitor structure 100 at a fabrication stage subsequent to FIG. 4B, according to an embodiment of the disclosure. A layer of dielectric material 420 may be formed over the electrode 112 and the substrate 102 using a conformal deposition technique, including a CVD process. The layer of dielectric material 420 may be continuous, lining the top surface and the side surfaces of the electrode 112, as well as the side surfaces of the dielectric layer 118 and the upper substrate surface 102$_U$. A layer of electrode material 414 may be subsequently formed over the layer of dielectric material 420 using a deposition technique, including a CVD process. Due to the presence of the electrode 112 under the layer of electrode material 414, the topography of the layer of electrode material 414 may be non-planar. In an embodiment of the disclosure, the layer of electrode material 414 may have a thickness substantially similar to the thickness of the electrode 112.

Processing continues with the patterning of the layer of dielectric material 420 and the layer of electrode material 414 using a patterning technique, including lithography and etching processes, to form the dielectric layer 120 and the electrode 114, respectively. Spacers 116, diffusion regions 108, and contacts 122 may be subsequently formed using processing techniques known in the art to form the capacitor structure 100, as illustrated in FIG. 1B.

As presented above, various embodiments of capacitor structures of semiconductor devices and methods of forming the same are presented. The capacitor structures 100 include capacitors having their capacitances connected in parallel. The capacitor structures 100 enables the formation of a compact semiconductor device to deliver high capacitances and low voltage coefficients to deliver greater device performance while achieving further miniaturization of IC chips.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about," or "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A capacitor structure, comprising:

a substrate;

a first electrode in the substrate;

a second electrode over the substrate;

a third electrode over the second electrode, the third electrode having a middle portion over the second electrode and end portions laterally adjacent to the second electrode; and a dielectric layer between the second electrode and the third electrode, the dielectric layer comprises a portion on an upper surface of the first electrode, wherein the portion of the dielectric layer separates an end portion of the third electrode from the first electrode.

2. The capacitor structure of claim 1, wherein the first electrode and the third electrode are at the same electrical potential.

3. The capacitor structure of claim 1, wherein the dielectric layer is a second dielectric layer, further comprising a first dielectric layer over the substrate, and the first dielectric layer and the second dielectric layer collectively surrounding the second electrode.

4. The capacitor structure of claim 3, wherein the first dielectric layer is between the first electrode and the second electrode.

5. The capacitor structure of claim 4, wherein the first dielectric layer laterally adjoins the second dielectric layer at an interface vertically over the first electrode.

6. The capacitor structure of claim 3, wherein the first dielectric layer has a first thickness, the second dielectric layer has a second thickness, and the first thickness is thinner than the second thickness.

7. The capacitor structure of claim 1, wherein the first electrode is a doped region in the substrate.

8. The capacitor structure of claim 1, further comprising a fourth electrode over the substrate, the fourth electrode is under the third electrode and laterally adjacent to the second electrode.

9. The capacitor structure of claim 8, wherein the fourth electrode is at the same electrical potential as the second electrode.

10. The capacitor structure of claim 8, wherein a portion of the third electrode is between the second electrode and the fourth electrode.

11. The capacitor structure of claim 1, wherein the second electrode includes a trench in an upper portion of the second electrode.

12. A capacitor structure, comprising:

a substrate;

a first capacitor, the first capacitor comprises a first electrode in the substrate and a second electrode over the substrate;

a second capacitor, the second capacitor comprises the second electrode and a third electrode over the second electrode, the third electrode having a middle portion over the second electrode and end portions laterally adjacent to the second electrode, wherein the first electrode, the second electrode, and the third electrode include dopants of the same conductivity; and the second capacitor further comprising a dielectric layer between the second electrode and the third electrode, the dielectric layer comprises a portion on an upper surface of the first electrode, wherein the portion of the dielectric layer separates the end portions of the third electrode from the first electrode.

13. The capacitor structure of claim 12, wherein the first electrode has a first dopant concentration, the second electrode has a second dopant concentration, and the first dopant concentration is at most as high as the second dopant concentration.

14. The capacitor structure of claim 13, further comprising a conductive well in the substrate, wherein the first electrode is in the conductive well.

15. The capacitor structure of claim 14, wherein the conductive well includes dopants having the same conductivity as the first electrode.

16. The capacitor structure of claim 15, further comprising diffusion regions laterally adjacent to the first electrode in the conductive well, the diffusion regions include dopants having the same conductivity as the conductivity well.

17. The capacitor structure of claim 16, wherein the diffusion regions have a third dopant concentration, and the third dopant concentration is substantially similar to the second dopant concentration.

18. A method of forming a capacitor structure, comprising:

forming a first electrode in a substrate;

forming a second electrode over the substrate;

forming a third electrode having a middle portion over the second electrode and end portions laterally adjacent to the second electrode; and forming a dielectric layer between the second electrode and the third electrode, the dielectric layer comprises a portion on an upper surface of the first electrode, wherein the portion of the dielectric layer separates the end portions of the third electrode from the first electrode.

19. The method of claim 18, further comprising:

forming a second dielectric layer between the first electrode in the substrate and the second electrode; and the first dielectric layer and the second dielectric layer collectively surrounding the second electrode.

20. The method of claim 18, further comprising:

doping the substrate to form the first electrode with dopants;

doping the second electrode with dopants having the same conductivity as the dopants in the first electrode; and doping with the second electrode with dopants having the same conductivity as the dopants in the first electrode.

* * * * *